US010181381B2

(12) United States Patent
Al-Hazmi et al.

(10) Patent No.: US 10,181,381 B2
(45) Date of Patent: Jan. 15, 2019

(54) TUNABLE SHAPE MEMORY CAPACITOR AND A METHOD OF PREPARATION THEREOF

(71) Applicant: King Abdulaziz University, Jeddah (SA)

(72) Inventors: Faten Ebrahim S. Al-Hazmi, Jeddah (SA); Fahrettin Yakuphanoglu, Elazig (TR); Ahmed A. Al-Ghamdi, Jeddah (SA); Yusuf Al-Turki, Jeddah (SA)

(73) Assignee: King Abdulaziz University, Jeddah (SA)

( * ) Notice: Subject to any disclaimer, the term of this patent is extended or adjusted under 35 U.S.C. 154(b) by 62 days.

(21) Appl. No.: 15/240,655

(22) Filed: Aug. 18, 2016

(65) Prior Publication Data

US 2018/0053603 A1  Feb. 22, 2018

(51) Int. Cl.
  *H01G 7/04* (2006.01)
  *H01G 5/017* (2006.01)
  (Continued)

(52) U.S. Cl.
  CPC ............ *H01G 7/04* (2013.01); *H01G 4/206* (2013.01); *H01G 7/021* (2013.01); *H01G 7/028* (2013.01); *H01L 41/193* (2013.01)

(58) Field of Classification Search
  CPC ....... H01G 5/0136; H01G 5/0134; H01G 7/04
  See application file for complete search history.

(56) References Cited

U.S. PATENT DOCUMENTS 6,068,782 A * 5/2000 Brandt ................ H05K 1/162
                                                 216/13
6,806,542 B1   10/2004 Zhang et al.
(Continued)

FOREIGN PATENT DOCUMENTS

CN        105355454 A    2/2016
WO        00/79550 A1    12/2000

OTHER PUBLICATIONS

Arshak, A., et al., Investigation of $TiO_2$ Thick Film Capacitors for Use as Strain Gauge Sensors, Sensors and Actuators A: Physical, vol. 122, No. 2, pp. 242-249, (Aug. 26, 2005) (Abstract only).
(Continued)

*Primary Examiner* — Eric W Thomas
(74) *Attorney, Agent, or Firm* — Oblon, McClelland, Maier & Neustadt, L.L.P.

(57) ABSTRACT

A variable capacitor device that includes a dielectric layer comprising a shape-memory polymer, a first metal plate and a second metal plate, wherein the dielectric layer is sandwiched between the first and the second metal plates. The shape-memory polymer has a first thickness at a first temperature under a first external compressive load, a second thickness at a second temperature under a second external compressive load, wherein the first thickness is greater than the second thickness, the second temperature is greater than the first temperature, and the second external compressive load is greater than the first external compressive load. The shape memory polymer having the second thickness is configured to convert to the shape-memory polymer having the first thickness when sequentially subjected to the first external compressive load and the second temperature.

16 Claims, 7 Drawing Sheets

(51) Int. Cl.
*H01G 7/02* (2006.01)
*H01G 4/20* (2006.01)
*H01L 41/193* (2006.01)

(56) References Cited

U.S. PATENT DOCUMENTS

2004/0130849 A1 7/2004 Kurihara et al.
2012/0218682 A1 8/2012 Komatsu et al.

OTHER PUBLICATIONS

Choudhury, N.A., et al., "Cross-Linked Polymer Hydrogel Electrolytes for Electrochemical Capacitors", Journal of the Electrochemical Society, vol. 153, No. 3, pp. 614-620, (2006).
Doraiswami, R., et al., "Shape Memory Capacitors for Next Generation Embedded Actives", 56th Electronic Components and Technology Conference 2006, 2 Pages total, (2006) (Abstract only).

* cited by examiner

TUNABLE SHAPE MEMORY CAPACITOR AND A METHOD OF PREPARATION THEREOF

BACKGROUND OF THE INVENTION

Technical Field

The present invention relates to a variable capacitor device and a method of preparation thereof. The variable capacitor device comprises a shape-memory polymer in the dielectric layer, wherein the capacitance of the variable capacitor is tuned by varying the thickness of the shape-memory polymer.

Description of the Related Art

The "background" description provided herein is for the purpose of gene all presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

With the recent trend toward diversification and greater functionality of electronic devices including computers and mobile terminals, solid electrolytic capacitors for use in electronic circuits that can withstand high voltage are becoming important for reducing power consumption. Variable/tunable capacitor technology has been confined to Micro Electro Mechanical Systems (MEMS). RF MEMS devices use air dielectrics and thick structural metals to reduce device losses and provide high quality factors. In addition, wide structural beams can be used without impairing device performance since the spring constant of a beam is primarily determined by its thickness. Tunable capacitors, inductors, resonators and RF switches have all been demonstrated [Yao, J. J., "RF MEMS from a device perspective", J. Micromech. Microeng., 2000, 10; Tilmans, H. A. C., De Raedt, W., and Beyne, E., "MEMS for wireless communications: from RF-MEMS components to RF-MEMS-SIP", Proc. Micromechanics Europe, Sinaia, Romania, 6-8 Oct. 2002]. However, the fabrication techniques for these devices vary considerably. Many RF MEMS tunable capacitors use a single gap approach. For electrostatically tuned capacitors with two parallel plates, pull-in can be shown to limit the tuning ratio to 1.5:1 [Dec, A., and Suyama, K., "A 1.9-GHz CMOS VCO with micro-machined electromechanically tunable capacitors", IEEE J. Solid-State Circuits, 2000, 35, (8)]. A two-gap electrostatic approach [Gallant, A. J., and Wood, D., "Nickel electroplated widely tunable micro-machined capacitor", Electron. Lett., 2002, 38, (24); Zou, J., Liu, C., and Schutt-cine, J., "Development of a wide-tuning range two-parallel-plate tunable capacitor for integrated wireless communication systems", Int, J. R F Microw. Comput, Aided Eng., 2001, 11; Nieminen, H., Ermolov, V., and Ryhanen, "Microelectromechan cal capacitor with wide tuning range", Electron. Lett., 2001, 37, (24)] is also a method of implementing these tunable capacitors. However, few investigations have been conducted on shape-memory polymers (SMPs) as solid dielectric materials for tunable capacitors.

Shape-memory polymers are increasingly being used in biomedical devices [Y. Liu, K. Gall, M. L. Dunn, A. R. Greenberg, and J. Diani, "Theirnomechanics of shape-memory polymers: Uniaxial experiments and constitutive modeling,", International Journal of Plasticity, vol. 22, no. 2, 2006; H. M. Wache, D. J. Tartakowska, A. Hentrich, and M. H. Wagner, "Development of a polymer stent with shape memory effect as a drug delivery system," Journal of Materials Science: Materials in Medicine, vol. 14, no. 2, 2003; M. F. Metzger, T. S. Wilson, D. Schumann, D. L. Matthews, and D. J. Maitland, "Mechanical properties of mechanical actuator for treating ischemic stroke," Biomedical Microdevices, vol. 4, no. 2, 2002], microsystems [E. Cheung, M. E. Karagozler, S. Park, B. Kim, and M. Sitti, "A new endoscopic microcapsule robot using beetle inspired microfibrillar adhesives," IEEE/ASME International Conference on Advanced Intelligent Mechatronics, AIM, vol. 1, pp. 551-557, 2005], aerospace and defense [P. A. Toensmeier, "Shape-memory polymers reshape product design", Plastics Engineering, pp. 10-11, 2005], and robotics [C. Duncheon, "Robots will be of service with muscles, not motors", Industrial Robot, vol. 32, no. 6, pp. 452 455, 2005]. A shape-memory polymer (SMIP) is a polymer material that can recover from a deformation to its original shape. To ascertain whether a polymer has shape memory, the material is subjected to a deformation at a temperature above the glass transition temperature. The material is then stored at a temperature below the glass transition temperature. If the material recovers its shape when being heated to a temperature beyond the glass transition temperature, then the material has a shape memory effect [K. Gall, P. Kreiner, D. Turner, and M. Hulse, "Shape-memory polymers for microelectromechanical systems", Microelectromechanical Systems, Journal of, vol. 13, no. 3, pp. 472-483. 1057-7157]. A polymer may be tailored to have a shape memory effect, if the material contains a soft phase and a hard phase. The soft phase controls the shape memory properties, whereas the structural characteristics of the material are given by the hard phase [Y. Liu, K. Gall, M. L. Dunn, A. R. Greenberg, and J. Diani, "Thermomechanics of shape-memory polymers: Uniaxial experiments and constitutive modeling", International Journal of Plasticity, vol. 22, no. 2, pp. 279-313, 2006; E. Cheung, M. E. Karagozler, S. Park, B. Kim, and M. Sitti, "A new endoscopic microcapsule robot using beetle inspired micro-fibrillar adhesives," IEEE/ASME International Conference on Advanced Intelligent Mechatronics, AIM, vol. 1, pp. 551-557, 2005]. The shape memory effect in polymer causes a lower residual stress and a larger recoverable strain when compared to their ceramic and metallic counterparts [C. Duncheon, "Robots will be of service with muscles, not motors", Industrial Robot, vol. 32, no. 6, pp. 452 455, 2005].

In view of the forgoing, one objective of the present invention is to provide a variable capacitor device and a method of preparation thereof. The variable capacitor device comprises a shape-memory polymer as the dielectric layer, wherein the capacitance of the variable capacitor is tuned by varying the thickness of the shape-memory polymer.

BRIEF SUMMARY OF THE INVENTION

According to a first aspect the present disclosure relates to a variable capacitor device, including i) a dielectric layer including a shape-memory polymer, ii) a first metal plate and a second metal plate, wherein the dielectric layer is sandwiched between the first and the second metal plates, wherein the shape-memory polymer has a first thickness at a first temperature under a first external compressive load, a second thickness at a second temperature under a second external compressive load, and the shape memory polymer having the second thickness is configured to convert to the shape-memory polymer having the first thickness when sequentially subjected to the first external compressive load and the second temperature, and wherein the first thickness is greater than the second thickness, the second temperature is greater than the first temperature, and the second external compressive load is greater than the first external compressive load.

In one embodiment, the variable capacitor device has a first capacitance at the first thickness and the first temperature, and a second capacitance at the second thickness and the second temperature, wherein a ratio of the second capacitance to the first capacitance is in the range of 2.5:1 to 1.5:1.

In one embodiment, the dielectric layer has a thickness in the range of 0.1-2 mm.

In one embodiment, the shape memory polymer has a glass transition temperature in the range 50-100° C.

In one embodiment, the shape-memory polymer is at least one selected from the group consisting of polyurethane, polyvinylidene difluoride, polylactic acid, polycaprolactone, polyethylene, polyethylene glycol, polyether ether ketone, polyethyl methacrylate, polystyrene, polytetramethylene glycol, polyisoprene, polybutadiene, poly(styrene-butadiene), polynorbomene, poly(norbomene-cyclooctene), poly(tert-butyl acrylate-butyl acrylate), poly(ethyleneterephthalate)-block-poly(ethyleneoxide), polystyrene-block-poly(1,4-butadiene), poly(2-ethyl-2-oxazoline)-block-poly(tetrahydrofuran)-block-poly(2-methyl-2-oxazoline), and epoxy.

In one embodiment, the dielectric layer further comprises at least one dopant selected from the group consisting of hydroxyapatite, polyhedral oligomeric silsesquioxane, titanium oxide nanoparticles, tin oxide nanoparticles, zinc oxide nanoparticles, zinc sulfide nanoparticles, cadmium oxide nanoparticles, graphene sheets, quantum dots, carbon nanotubes, and fullerenes.

In one embodiment, a volume fraction of said dopant is in the range of 0.005-0.1, with the volume fraction being relative to the total volume of the dielectric layer.

In one embodiment, a morphology of said dopant is at least one selected from the group consisting of a nanosphere, a nanosheet, a nanotube, a nanofiber, a nanowire, a nanodisk, a nanocube, a nanorod, a nanoring, and a nanostar.

In one embodiment, said dopant has an average particle size in the range of 1-100 nm.

In one embodiment, the shape memory polymer is a polyvinyl alcohol polymer which is crosslinked with a crosslinking agent having at least two aldehyde groups or at least two carboxyl groups.

In one embodiment, the crosslinking agent is glutaraldehyde.

In one embodiment, each of the first and the second metal plates comprises one metal selected from the group consisting of gold, platinum, silver, copper, aluminum, and titanium.

According to a second aspect the present disclosure relates to a variable capacitor device, including i) a dielectric layer including a triple shape-memory polymer, ii) a first metal plate and a second metal plate, wherein the dielectric layer is sandwiched between the first and the second metal plates, wherein the triple shape-memory polymer has a first thickness at a first temperature under a first external compressive load, a second thickness at a second temperature under the first external compressive load, a third thickness at a third temperature under a second external compressive load, and the triple shape memory polymer having the third thickness is configured to convert to the triple shape-memory polymer having the second thickness when sequentially subjected to the first external compressive load and the second temperature, and the triple shape memory polymer having the second thickness is configured to convert to the triple shape-memory polymer having the first thickness when sequentially subjected to the first external compressive load and the third temperature, and wherein the first thickness is greater than the second thickness and the second thickness is greater than the third thickness, the third temperature is greater than the second temperature and the second temperature is greater than the first temperature, and the second external compressive load is greater than the first external compressive load.

In one embodiment, the variable capacitor device has a first capacitance at the first thickness and the first temperature, a second capacitance at the second thickness and the second temperature, and a third capacitance at the third thickness and the third temperature, wherein a ratio of the third capacitance to the second capacitance is in the ange of 2.5:1 to 1.5:1, and a ratio of the second capacitance to the first capacitance is in the range of 2.5:1 to 1.5:1.

In one embodiment, the triple shape-memory polymer is a combination of two shape-memory polymers each is selected from e group consisting of polyurethane, polyvinylidene difluoride, polylactic acid, polycaprolactone, polyethylene, polyethylene glycol, polyether ether ketone, polyethyl methacrylate, polystyrene, polytetramethylene glycol, polyisoprene, polybutadiene, polystyrene-butadiene), polynorbomene, poly(norbornene-cyclooctene), poly(tert-butyl acrylate-butyl acrylate), poly(ethyleneterephthalate)-block-poly(ethyleneoxide), polystyrene-block-poly(1,4-butadiene), poly(2-methyl-2-oxazoline)-block-poly(tetrahydrofuran)-block-poly(2-methyl-2-oxazoline), and epoxy.

In one embodiment, the triple shape-memory polymer is an interpenetrating polymer network of two crosslinked polymers having a glass transition temperature difference within the range of 50-200° C.

According to a third aspect the present disclosure relates to a method of manufacturing a variable capacitor device, involving i) mixing polyvinyl alcohol and a crosslinking agent in water to form a polymer solution, wherein a concentration of the polyvinyl alcohol in the polymer solution is in the range of 0.01%-10% by weight, and wherein a concentration of the crosslinking agent in the polymer solution is in the range of 0.001 to 10.0 M, ii) casting the polymer solution in a mold to form a polymer film having a thickness of no more than 2 nm, iii) removing the polymer film from the mold, after a water content of the polymer film is reduced to less than 5 wt %, iv) sandwiching the polymer film between a first and a second metal plate, wherein the first and the second metal plates are substantially similar.

In one embodiment, the method further involves coating opposing side surfaces of the polymer film with a metal prior to the sandwiching.

In one embodiment, the method further involves adding a dopant to the polymer solution prior to the casting, wherein the dopant is at least one selected from the group consisting of hydroxyapatite, polyhedral oligomeric silsesquioxane, titanium oxide nanoparticles, tin oxide nanoparticles, zinc oxide nanoparticles, zinc sulfide nanoparticles, cadmium oxide nanoparticles, graphene sheets, quantum dots, carbon nanotubes, and fullerenes.

In one embodiment, the crosslinking agent is glutaraldehyde.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figures 1A, 1B:
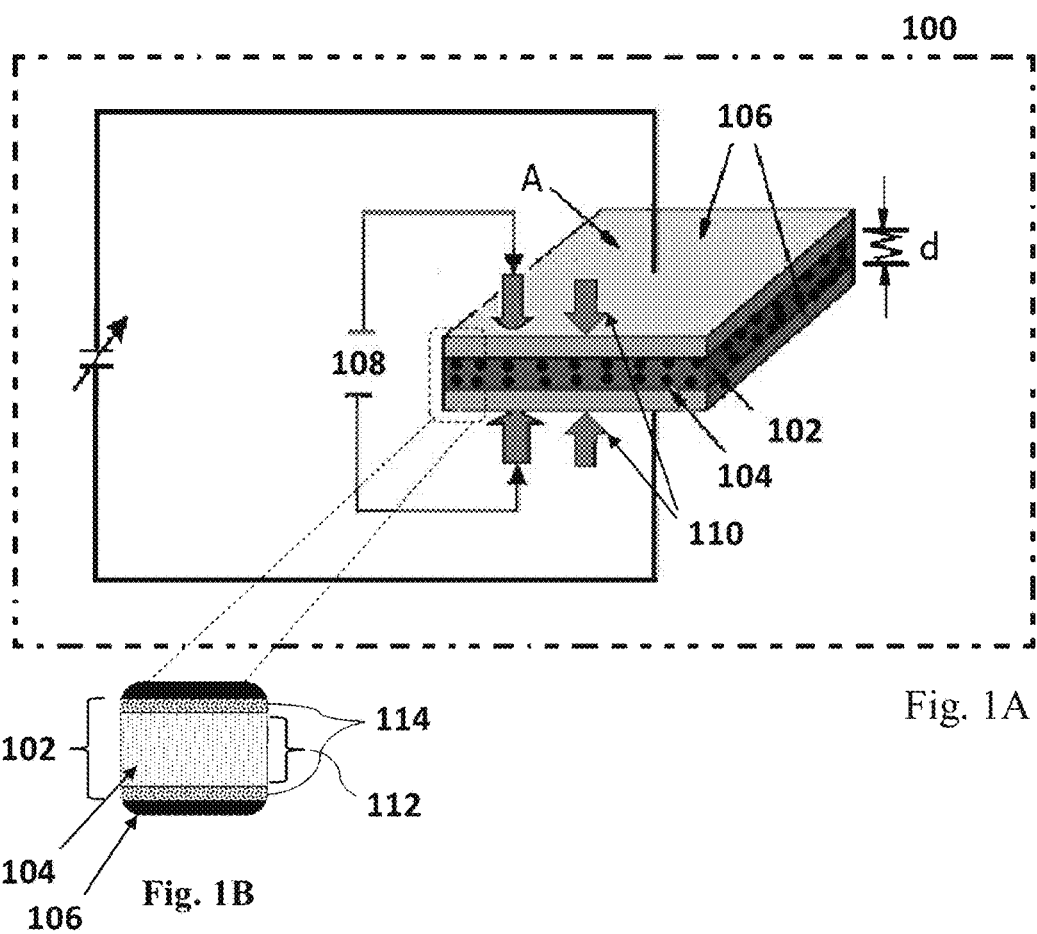
FIG. 1A illustrates a variable capacitor device.
FIG. 1B is a magnified illustration of a cross-section of the variable capacitor device.
Figure 2:
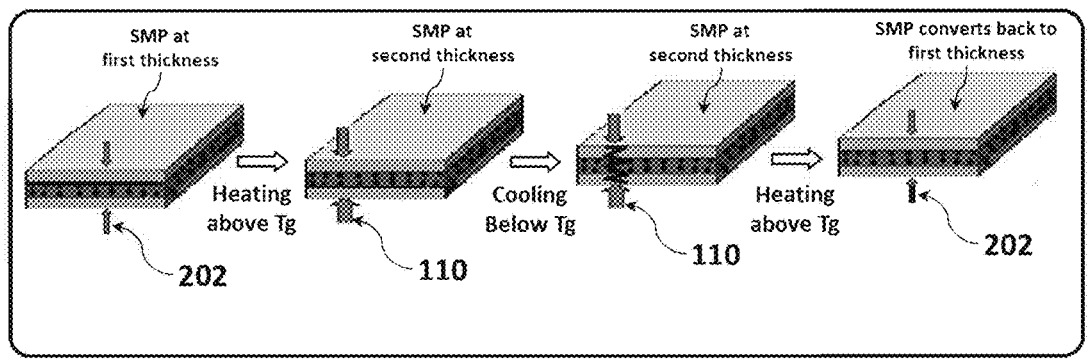
FIG. 2 illustrates a step-wise functioning of the variable capacitor device.

Referring now to the drawings, wherein like reference numerals designate identical or corresponding parts throughout the several views.

According to a first aspect the present disclosure relates to a variable capacitor device 100, including a dielectric layer 102 that includes a shape-memory polymer 112.

The variable capacitor device as used herein refers to a capacitor, wherein a capacitance of the capacitor changes upon changing the temperature of the capacitor. Capacitance of a capacitor refers to an ability of the capacitor to store an electrical charge. For example, a capacitor with a larger capacitance is able to store more electrical charges at a given voltage than a capacitor with a smaller capacitance. Capacitance of a capacitor that comprises two parallel plates each having a surface area A and are separated by a distance d can be found by the following equation:

$$C = \varepsilon_r \varepsilon_0 \frac{A}{d}$$

wherein C is the capacitance, A is an overlapping surface area of the two parallel plates, $\varepsilon_r$ is relative permittivity (or dielectric constant) of a material between the two parallel plates, $\varepsilon_0$ is an electric constant (i.e. $\varepsilon_0 \approx 8.854 \times 10^{-12}$ F·m$^{-1}$), and d is a distance between the two parallel plates.

The dielectric layer as used herein refers to an electrical insulator, which is placed in between electrodes of a capacitor, and it can be polarized by an electric field applied to the electrodes. The dielectric layer 102 may have a thickness in the range of 0.1-2 mm, preferably 0.1-1 mm, more preferably 0.5-1 mm for small size capacitors having a capacitance in the range of 10 μF-1 μF, preferably 10 nF-1 μF. The dielectric layer 102 may be a thin film having a thickness in the range 100 nm-500 μm, preferably 1-100 μm, more preferably 50-100 μm, for capacitors used in microcircuits having a capacitance in the range of 1 pF-10 nF, preferably 10 pF-1 nF. Depending on a structure of the variable capacitor device, the dielectric layer 102 may have different shapes. For example, the variable capacitor device 100 may be a parallel plate capacitor with a planar dielectric layer, a coaxial cylindrical capacitor with a hollow cylindrical dielectric layer, a concentric spherical capacitor with a hollow spherical dielectric layer, or a concentric hemispherical capacitor with a hollow hemispherical dielectric layer. The dielectric layer may also have an irregular shape.

Shape-memory polymer (SMP) as used herein refers to a type of polymeric materials that have the ability to return from a deformed shape (i.e. a temporary shape) to an original shape (i.e. a permanent shape) when induced by an external stimulus (e.g. temperature change). The shape-memory polymer 112 may be stimulated by electric field, magnetic field, electromagnetic radiation, and/or a chemical solution, however, in a preferred embodiment the shape-memory polymer 112 is stimulated by a temperature change and/or a compressive pressure change.

The shape-memory polymer (SMP) 112 has a first thickness at a first temperature under a first external compressive load 202, a second thickness at a second temperature under a second external compressive load 110. Accordingly, the first thickness is greater than the second thickness, the second temperature is greater than the first temperature, and the second external compressive load 110 is greater than the first external compressive load 202.

In one embodiment, when the SMP 112 is heated to the second temperature, it may turn into a rubbery state (i.e. above Tg) from a glassy state (i.e. below Tg). Glass transition temperature (or Tg) refers to a reversible transition in an amorphous material (or in amorphous regions within a semi-crystalline material), wherein said material turn from a hard and relatively brittle (or glassy) state into a molten or rubber-like state as the temperature is increased. In one embodiment, glass transition temperature of the SMP 112 is within the range of −50° C. to 200° C., preferably 0° C. to 150° C., more preferably 50° C. to 150° C.

Accordingly, the first temperature is a temperature below a glass transition temperature of the SMP, whereas the second temperature is a temperature above the glass transition temperature. Therefore, the SMP may be in a glassy state at the first temperature, whereas it may be in a rubbery state at the second temperature. In one embodiment, a difference between the first and the second temperature is at least 20° C., preferably at least 50° C., more preferably at least 70° C., but not more than 120° C. In a preferred embodiment, the first temperature is a temperature between β-transition and α-transition (i.e. glass transition temperature) of the SMP, whereas the second temperature is a temperature between glass transition temperature and melting temperature (or glass transition temperature and decomposition temperature) of the SMP, wherein a difference between the first and the second temperature is at least 20° C., preferably at least 50° C., more preferably at least 80° C., but not more than 150° C.

The shape-memory polymer 112 may be subjected to the second external compressive load 110, when it is at the second temperature (i.e. in the rubbery state). In a preferred embodiment, the second external compressive load 110 provides a compressive stress in the SMP 112 that is larger than a yield strength of said polymer, and therefore the SMP 112 plastically deforms to the second thickness from the first thickness (i.e. an initial thickness). Yield strength refers to a stress beyond which a material begins to defoini plastically. In one embodiment, the yield strength of the SMP is in the range of 1-150 MPa, preferably 5-50 MPa, more preferably 10-50 MPa. In one embodiment, the second thickness is less than 90%, preferably less than 80%, or preferably less than 70%, or preferably less than 60%, or preferably less than 50%, or preferably less than 40%, or preferably less than 30%, or preferably less than 20% of the first thickness. For example, if the SMP 112 has an initial thickness (i.e. the first thickness) of about 2 mm, the second thickness may be less than 1.8 mm, preferably less than 1.6 mm, or preferably less than 1.4 mm, or preferably less than 1.2 mm, or preferably less than 1 mm, or preferably less than 0.8 mm, or preferably less than 0.6 mm, or preferably less than 0.4 mm.

In one embodiment, the second external compressive load 110 provides a compressive stress which is at least 10 MPa, preferably at least 20 MPa, or preferably at least 30 MPa, or preferably at least 40 MPa, or preferably at least 50 MPa larger than the yield strength of the SMP 112 in the rubbery state, while at least 10 MPa, preferably at least 15 MPa, or preferably at least 20 MPa smaller than a compressive strength of the SNIP 112 in the rubbery state. In another embodiment, the first external compressive load 202 provides a compressive stress which is at least 10 MPa, preferably at least 15 MPa, or preferably at least 20 MPa smaller than the yield strength of the SMP 112 in the glassy state. Although the second external compressive load preferably creates a uniform compressive stress within the SMP, it may also create a non-uniform compressive stress within the SMP, for example, by applying the second external compressive load to a local section of the SMP. Accordingly, the shape memory polymer having the second thickness converts back to the shape-memory polymer 112 having the first thickness when sequentially subjected to the first external compressive load 202 and the second temperature.

In a preferred embodiment, the first external compressive load 202 is zero, which means that there is no compressive stress on the dielectric layer 102. In another preferred embodiment, the second external compressive load 110 is provided by an electric, a hydraulic, and/or a pneumatic actuator. Said actuator may be controlled by a closed loop control system (e.g. a DCS) which is activated by a change in the thickness of the dielectric layer. For example, the control system activates the actuator to generate the second external compressive load 110, when the dielectric layer 102 has the first thickness, and further stops the actuator to provide the first external compressive load 202, when the dielectric layer 102 has the second thickness.

A tunable shape-memory capacitor as used herein refers to a capacitor whose capacitance can be tuned to a predetermined capacitance. Tuning the capacitor may be achieved by varying the thickness of the dielectric layer (e.g. using a shape-memory polymer in the dielectric layer), varying the temperature of the dielectric layer (which causes a change in the dielectric constant of the dielectric layer), adding fillers to the structure of the dielectric layer (e.g. adding metal, semiconductor, or insulator nanoparticles), adding an electrolyte solution with a known dielectric constant to the structure of the dielectric layer (e.g. the dielectric layer or the shape memory polymer may be swollen by the electrolyte solution), or adding a second polymer to the structure of the dielectric layer (e.g. a layer of a conducting polymer layer).

In addition, a heating element 108 coupled with a closed loop controlsystem is adopted, wherein the closed loop control system activates or deactivates the heating element. The closed loop control system may be activated or deactivated by a displacement signal which is received from a displacement sensor such as a strain gauge, an LVDT, or a laser beam. For example, when the dielectric layer is at the second thickness, the closed loop control system switches on the heating element 108, causing the shape-memory polymer 112 to deform until it reaches to a predetermined thickness, wherein the closed loop control system switches off the heating element 108. The heating element 108 may be a filament that heats up when an electric current passes through it.

In one embodiment, the shape-memory polymer 112 is one selected from the group consisting of polyvinyl alcohol, polyurethane, polyvinylidene ditluoride, polylactic acid, polycaprolactone, polyethylene, polyethylene glycol, polyether ether ketone, polyethyl methacrylate, polystyrene, polytetramethylene glycol, polyisoprene, polybutadiene, poly(styrene-butadiene), polynorbornene, poly(norbornene-cyclooctene), poly(tert-butyl acrylate-butyl acrylate), poly(ethyleneterephthalate)-block-poly(ethyleneoxide), polystyrene-block-poly(1,4-butadiene), poly(2-methyl-2-oxazoline)-block-poly(tetrahydrofuran)-block-poly(2-ethyl-2-oxazoline) and poly(ε-caprolactone). In a preferred embodiment, the shape memory polymer has a glass transition temperature in the range −50-200° C., preferably 0-150° C., more preferably 50-150° C.

In a preferred embodiment, the shape-memory polymer 112 comprises polyvinyl alcohol and one or more of polylactic acid, polyethylene glycol, polyethyl methacrylate, polystyrene, poly(norbomene-cyclooctene), poly(tert-butyl acrylate-butyl acrylate), poly(ethyleneterephthalate)-block-poly(ethyleneoxide), polystyrene-block-poly(1,4-butadiene), poly(2-methyl-2-oxazoline)-block-poly(tetrahydrofuran)-block-poly(2-methyl-2-oxazoline), and poly(s-caprolactone), wherein at least 50 wt %, preferably at least 60 wt %, more preferably at least 70 wt % of the SMP is polyvinyl alcohol, with weight percent being relative to the total weight of the SMP. For example, in one preferred embodiment, the SMP comprises polyvinyl alcohol and poly(ε-caprolactone), wherein at least 50 wt %, preferably at least 60 wt %, more preferably at least 70 wt % of the SMP is polyvinyl alcohol, with weight percent being relative to the total weight of the SMP.

A volume fraction of the shape-memory polymer 112 in the dielectric layer 102 may be at least 0.3, preferably at least 0.4, or preferably at least 0.5, or preferably at least 0.6, or preferably at least 0.7, or preferably at least 0.8, or preferably at least 0.9 by volume, with the volume fraction being relative to the total volume of the dielectric layer. For example, in one embodiment, a dielectric layer comprises 70 vol % of a SMP, whereas the remaining 30 vol % may comprise one or more of an electrolyte solution, a conducting polymer layer, and dopants.

In one preferred embodiment, the shape memory polymer is a polyvinyl alcohol polymer. The polyvinyl alcohol polymer may be in a crosslinked form. A crosslinked polyvinyl alcohol polymer may refer to a structure, wherein a crosslinking agent having at least two aldehyde groups or at least two carboxyl groups chemically bonds at least two adjacent polyvinyl alcohol polymer chains together to form the crosslinked polyvinyl alcohol polymer. The crosslinking agent may preferably be glutaraldehyde. In another embodiment, the polyvinyl alcohol polymer is not in a crosslinked form (i.e. polymer chains are physically bonded (e.g. entanglement) without having covalent bonds therebetween).

In another embodiment, the shape memory polymer comprises or is made of at least one crosslinked polymer including, but not limited to nylon 66, poly(hexamethylene-diamine-terephthalic acid), poly(paraphenylenediamine-terephthalic acid), polyhexahydrotriazine, polyisocyanurate, polyglycolide, polycaprolactone, polyhydroxyalkanoate, polyhydroxybutyrate, polyethylene adipate, polybutylene succinate, poly(3-hydroxybutyrate-co-3-hydroxyvalerate), polyethylene terephthalate, polybutylene terephthalate, polytrimethylene terephthalate, polyethylene naphthalate, vinyl ester, epoxy (e.g. amine-cured epoxy systems or anhydride-cured epoxy systems), polyester, polyimide, polyamide-imides, phenolic polymers, bis-maleimide polymers, silicone rubber, and vulcanized rubber. In a preferred embodiment, the crosslinked polymer has an average coefficient of thermal expansion in the range of $10^{-5}$-$10^{-3}$ $K^{-1}$, preferably $5 \times 10^{-5}$-$5 \times 10^{-4}$ $K^{-1}$, more preferably $10^{-4}$-$5 \times 10^{-4}$ $K^{-1}$, even more preferably $2 \times 10^{-4}$-$4 \times 10^{-4}$ $K^{-1}$. Accordingly, the crosslinked polymer linearly expands at least $10^{-6}$ cm, preferably at least $5 \times 10^{-6}$ cm, more preferably at least $10^{-5}$ cm per one degree Celsius (expansion in one direction is considered here, assuming the SMP 112 is isotropic). The "coefficient of thermal expansion" as used herein refers to a fractional change in volume of a material per degree change in temperature at a constant pressure. The coefficient of thermal expansion is an inherent property of a viscoelastic material, and is different than a strain recovery rate, which is defined as the ability of a shape-memory polymer 112 to memorize its permanent shape. In a shape-memory polymer, the strain recovery rate may be few orders of magnitude larger than the coefficient of thermal expansion.

In a preferred embodiment, the SMP 112 is a porous polymer having a pore volume fraction in the range of 0.0001-0.05, preferably 0.001-0.01, more preferably 0.005-0.01, with the pore volume fraction being relative to the total volume of the SMP. According to this embodiment, the SMP is capable of swelling an electrolyte solution having a dielectric constant within the range of 1-200 at room temperature (i.e. at 25° C. A capacitance of the variable capacitor device may be tuned when the SMP swells an electrolyte solution having a predetermined dielectric constant.

In a preferred embodiment, the shape-memory polymer 112 has a compressive strength in range of 10-500 MPa, preferably 50-200 MPa, more preferably 50-100 MPa.

In one embodiment, the dielectric layer 102 further includes at least one dopant 104 selected from the group consisting of polyhedral oligomeric silsesquioxane, nanodiamonds, graphene sheets, quantum dots, carbon nanotubes, and fullerenes, in one embodiment, the dopant 104 may be in the form of nanoparticles which are selected from the group consisting of aluminum oxide, silica, silicon dioxide, silicon carbide, aluminum nitride, aluminum titanate, barium ferrite, barium strontium titanium oxide, barium zirconate, boron carbide, boron nitride, zinc oxide, tungsten oxide, cobalt aluminum oxide, silicon nitride, zinc titanate, zirconium oxide, antimony tin oxide, cerium oxide, barium titanate, bismuth cobalt zinc oxide, bismuth oxide, calcium oxide, calcium titanate, calcium zirconate, cerium zirconium oxide, chromium oxide, cobalt oxide, copper iron oxide, copper oxide, copper zinc iron oxide, dysprosium oxide, erbium oxide, europium oxide, gadolinium oxide, holmium oxide, indium hydroxide, indium oxide, indium tin oxide, iron nickel oxide, iron oxide, lanthanum oxide, lithium titanate, magnesium aluminate, magnesium hydroxide, magnesium oxide, manganese oxide, molybdenum oxide, neodymium oxide, nickel cobalt oxide, nickel oxide, nickel zinc iron oxide, samarium oxide, samarium strontium cobalt oxide, strontium ferrite, strontium titanate, terbium oxide, tin oxide, titanium carbide, titanium carbonitride, titanium dioxide, titanium oxide, titanium silicon oxide, ytterbium oxide, yttrium oxide, yttrium aluminum oxide, yttrium iron oxide, and zinc iron oxide. In a preferred embodiment, the dopant 104 is hydroxyapatite. In one embodiment, a volume fraction of the dopant 104 is in the range of 0.005-0.1, preferably 0.005-0.05, more preferably 0.01-0.05 with the volume fraction being relative to the total volume of the dielectric layer. In one embodiment, the dopant 104 has an average particle size in the range of 1-100 nm, preferably 5-50 nm, more preferably 10-30 nm. In one embodiment, a morphology of said dopant 104 is at least one selected from the group consisting of a nanosphere, a nanosheet, a nanotube, a nanofiber, a nanowire, a nanodisk, a nanocube, a nanorod, a nanoring, and a nanostar. The dopant 104 are dispersed within a matrix of the dielectric layer, however, said dopant may be agglomerated within the dielectric layer 102 having an agglomeration size of less than 1.5 μm, preferably less than 0.75 μm, more preferably less than 0.5 nm. In another embodiment, the dopants are functionalized with reactive moieties, which are capable of forming covalent bonds to the SMP 112. For example, aldehyde-functionalized graphene is capable of forming covalent bonds with polyvinyl alcohol, or amine-functionalized polyhedral oligomeric silsesquioxane (POSS) or carbon nanotubes are capable of forming covalent bonds with epoxide groups present in an epoxy. Dopants such as carbon nanotubes, graphene sheets, or fullerene may require an acid treatment, plasma treatment, and/or heat treatment prior to functionalization with reactive moieties.

In another embodiment, the dopants 104 are quantum dots having a size n the range of 1-50 nm, preferably 1-20 nm, more preferably 2-10 nm. The quantum dots may be core-type quantum dots, core-shell quantum dots, and/or alloyed quantum dots. Exemplary quantum dots may include, but are not limited to PbS core-type quantum dots, CdSe/ZnS core-shell type quantum dots, CdSeS/ZnS alloyed quantum dots, CdTe core-type quantum dots, InP/ZnS quantum dots, PbSe core-type quantum dots, and chalcogenides (i.e. selenides or sulfides) of metals (e.g. CdSe or ZnSe).

In one embodiment, the dielectric layer 102 further includes at least one conducting polymer layer 114 deposited on the SMP 112. Said conducting polymer layer 114 comprises or is made of at least one polymer selected from the group consisting of polypyrrole, polyaniline, polythiophene, poly(3,4-ethylenedioxy-thiophene), poly(3-alkylthiophenes), polyacetylene, polyphenylene vinylene, and polyphenylene sulfide. The conducting polymer layer 114 may have a thickness in the range of 0.1-1 mm, preferably 0.1-0.5 mm, more preferably 0.1-0.2 mm, relative to the thickness of the SMP 112 which is in the range of 0.1-2 mm, preferably 0.1-1 mm, more preferably 0.5-1 mm; or a thickness in the range of 100 μm-1 mm, preferably 500 μm-1 mm, relative to the thickness of the SMP 112 which is in the range 10 nm-500 μm, preferably 100 nm-100 μm; or a thickness in the range of 0.1-5 mm, preferably 0.5-2 mm, relative to the thickness of the SMP 112 which is in the range of 0.1-20 mm, preferably 5-10 mm, more preferably about 5 mm. In one embodiment, the dielectric layer 102 includes two conducting polymer layers 114, wherein the SMP 112 is sandwiched therebetween. According to this embodiment, a composition of a first conducting polymer layer is substantially similar to the composition of a second conducting polymer layer, even though the composition of the first and the second conducting polymer layers can be different. A volume fraction of the conducting polymer layer 114 in the dielectric layer 102 may be less than 0.3, preferably less than 0.2, more preferably less than 0.1, with the volume fraction being relative to the total volume of the dielectric layer.

The variable capacitor device 100 further includes a first metal plate 106 and a second metal plate 106, wherein the dielectric layer 102 is sandwiched between the first and the second metal plates 106. The first and the second metal plates 106 may have a thickness in the range of 0.1-5 mm, preferably 0.5-5 mm, more preferably 0.5-2 mm, relative to the thickness of the dielectric layer 102 which is in the range of 0.1-2 mm, preferably 0.1-1 mm, more preferably 0.5-1 mm; or a thickness in the range of 100 µm-2 mm, preferably 500 µm-1 mm, relative to the thickness of the dielectric layer 102 which is in the range 10 nm-500 µm, preferably 100 nm-100 µm; or a thickness in the range of 0.1-40 mm, preferably 1-20 mm, relative to the thickness of the dielectric layer 102 which is in the range of 0.1-20 mm, preferably 5-10 mm, more preferably about 5 mm. The first and the second metal plates 106 may have an overlapping surface area in the range of 100 $mm^2$-50 $cm^2$, preferably 500 $mm^2$-2 $cm^2$ for small size capacitors having a capacitance in the range of 10 pF-1 µF, preferably 10 nF-1 µF. The first and the second metal plates 106 may have an overlapping surface area in the range 1 $mm^2$-100 $mm^2$, preferably 10 $mm^2$-20 $mm^2$ for capacitors used in microcircuits having a capacitance in the range of 1 pF-10 nF, preferably 10 pF-1 nF.

In one embodiment, each of the first and the second metal plates 106 comprises one metal selected from the group consisting of gold, platinum, silver, copper, aluminum, titanium, vanadium, chromium, nickel, palladium, rhenium, tellurium, iron, iridium, osmium, rhodium, tantalum, and zirconium. In another embodiment, each of the first and the second metal plates 106 is a metal alloy that is comprised of two or more of gold, platinum, silver, copper, aluminum, titanium, vanadium, chromium, nickel, palladium, rhenium, tellurium, iron, iridium, osmium, rhodium, tantalum, and zirconium. The first and the second metal plates 106 may preferably be made of substantially similar metals, although each can be made of a different metal. In a preferred embodiment, the first and the second metal plates 106 are selected from metals having a work function of at least 4 eV, preferably at least 4.5 eV, more preferably 5 eV. In one embodiment, at least 50%, preferably at least 80%, more preferably at least 95%, even more preferably at least 99% of a surface area of the first and the second metal plates 106 are in contact with the dielectric layer.

In one embodiment, the variable capacitor device 100 has a first capacitance at the first thickness and the first temperature, and a second capacitance at the second thickness and the second temperature, wherein a ratio of the second capacitance to the first capacitance is in the range of 2.5:1 to 1.5:1, preferably 2:1 to 1.5:1.

According to a second aspect the present disclosure relates to a variable capacitor device, including a dielectric layer including a triple shape-memory polymer.

As described, a shape-memory polymer (or a dual shape-memory polymer) only changes from a temporary shape back to a permanent shape at a particular temperature. In contrast, a triple shape-memory polymer (triple SMP) may switch from one temporary shape to another at a first transition temperature, and then it may convert back to a permanent shape at another transition temperature. A triple SMP may comprise of at least two dual shape-memory polymers with different glass transition temperatures. For example, a triple SMP may comprise segments of poly(ε-caprolactone), polyethers, polyether urethanes, polyimides, polyether imides, poly(meth)acrylate, polyurethane, polyvinyl compounds, polystyrenes, polyoxymethylene or poly(para-dioxanone). Polymer networks, which enable a triple shape-memory effect, can be configured as AB-networks, where both chain segments contribute to the elasticity.

The triple shape-memory polymer may be an interpenetrating polymer network comprised of a first and a second SMP, wherein each is a crosslinked polymer selected from the group consisting of nylon 66, poly(hexamethylenediamine-terephthalic acid), poly(paraphenylenediamine-terephthalic acid), polyhexahydrotriazine, polyisocyanurate, polyglycolide, polycaprolactone, polyhydroxyalkanoate, polyhydroxybutyrate, polyethylene adipate, polybutylene succinate, poly(3-hydroxybutyrate-co-3-hydroxyvalerate), polyethylene terephthalate, polybutylene terephthalate, polytrimethylene terephthalate, polyethylene naphthalate, vinylester, epoxy, polyester, polyurethane, polyimide, polyamide-imides, phenolic polymers, bis-maleimide polymers, silicone rubber, and vulcanized rubber. An interpenetrating polymer network (i.e. IPN) refers to a polymer comprising two or more networks that are at least partially interlaced on a polymer scale but not covalently bonded to each other. Interlaced polymer networks in an IPN cannot be separated unless chemical bonds are broken. The interlaced polymer networks can be envisioned to be entangled in such a way that they are concatenated and cannot be pulled apart, but not bonded to each other by any chemical bond. In one embodiment, a glass transition temperature difference of the two crosslinked polymers in the interpenetrating polymer network is at least 20° C., preferably at least 50° C., more preferably at least 80° C. The triple SMP may also be produced by combining a first and a second SMP, wherein each is selected from the group consisting of polyurethane, polyvinylidene difluoride, polylactic acid, polycaprolactone, polyethylene, polyethylene glycol, polyether ether ketone, polyethyl methacrylate, polystyrene, polytetramethylene glycol, polyisoprene, polybutadiene, poly(styrene-butadiene), polynorbornene, poly(norbornene-cyclooctene), poly(tert-butyl acrylate-butyl acrylate), poly(ethyleneterephthalate)-block-poly(ethyleneoxide), polystyrene-block-poly(1,4-butadiene), and poly(2-methyl-2-oxazoline)-block-poly(tetrahydrofuran)-block-poly(2-methyl-2-oxazoline). In a preferred embodiment, the triple SMP comprises polyvinyl alcohol and one or more of polylactic acid, polyethylene glycol, polyethyl methacrylate, polystyrene, poly(norbornene-cyclooctene), poly(tert-butyl acrylate-butyl acrylate), poly(ethyleneterephthalate)-block-poly(ethyleneoxide), polystyrene-block-poly(1,4-butadiene), poly(2-methyl-2-oxazoline)-block-poly(tetrahydrofuran)-block-poly(2-methyl-2-oxazoline), and poly(ε-caprolactone), wherein at least 50 wt %, preferably at least 60 wt %, more preferably at least 70 wt % of the triple SMP is polyvinyl alcohol, with weight percent being relative to the total weight of the triple SMP. For example, in one preferred embodiment, the triple SMP comprises polyvinyl alcohol and poly(ε-caprolactone), wherein at least 50 wt %, preferably at least 60 wt %, more preferably at least 70 wt % of the triple SMP is polyvinyl alcohol, with weight percent being relative to the total weight of the triple SMP.

The triple SMP has a first thickness at a first temperature under a first external compressive load, a second thickness at a second temperature under the first external compressive load, and a third thickness at a third temperature under a second external compressive load. Accordingly, the first thickness is greater than the second thickness and the second thickness is greater than the third thickness, the third temperature is greater than the second temperature and the second temperature is greater than the first temperature, and the second external compressive load is greater than the first external compressive load.

In one embodiment, the triple SMP is an interpenetrating polymer network comprised of a first and a second SMP. When the triple SMP is heated to the second temperature, the first SMP (i.e. a constituent polymer in the triple SMP) may turn into a rubbery state (i.e. above Tg) from a glassy state (i.e. below Tg), whereas the second SMP may remain in the glassy state. According to this embodiment, both of the first and the second SMPs are in glassy state at the first temperature, whereas both of the first and the second SMPs are in rubbery state at the third temperature. Accordingly, the first temperature is a temperature below the glass transition temperatures of both the first and the second SMPs, the second temperature is a temperature in between the glass transition temperatures of the first and the second SMPs (e.g. above the glass transition temperature of the first SMP and below the glass transition temperature of the second SMP), and the third temperature is a temperature above the glass transition temperatures of both the first and the second SMPs. In one embodiment, a difference between the first and the second temperature is at least 20° C., preferably at least 30° C., more preferably at least 50° C., but not more than 80° C. Besides, a difference between the second and the third temperature is at least 20° C., preferably at least 30° C., more preferably at least 50° C., but not more than 80° C.

In a preferred embodiment, the triple SMP is subjected to the second external compressive load, when it is at the third temperature, and it may be subjected to the first external compressive load when it is at the first and the second temperatures. According to this embodiment, the second external compressive load provides a compressive stress in the triple SMP that is larger than a yield strength of the first and the second SMP, and therefore the triple SMP plastically deforms to the third thickness from the first thickness (i.e. an initial thickness). In one embodiment, the third thickness is less than 90%, preferably less than 80%, or preferably less than 70%, or preferably less than 60%, or preferably less than 50%, or preferably less than 40%, or preferably less than 30%, or preferably less than 20% of the first thickness. For example, if the triple SMP has an initial thickness (i.e. the first thickness) of about 2 mm, the third thickness may be less than 1.8 mm, preferably less than 1.6 mm, or preferably less than 1.4 m or preferably less than 1.2 mm, or preferably less than 1 mm, or preferably less than 0.8 mm, or preferably less than 0.6 mm, or preferably less than 0.4 mm.

In one embodiment, the second external compressive load provides a compressive stress which is at least 10 MPa, preferably at least 20 MPa, or preferably at least 30 MPa, or preferably at least 40 MPa, or preferably at least 50 MPa larger than the largest yield strength in the first and the second SMP in the rubbery state, while at least 10 MPa, preferably at least 15 MPa, or preferably at least 20 MPa smaller than the smallest compressive strength in the first and the second SMP in the rubbery state. In another embodiment, the first external compressive load provides a compressive stress which is at least 10 MPa, preferably at least 15 MPa, or preferably at least 20 MPa smaller than the smallest yield strength in the first and the second SMP in the glassy state.

Accordingly, the triple SMP having the third thickness converts back to the triple SMP having the second thickness when sequentially subjected to the first external compressive load and the second temperature. Further, the triple shape memory polymer having the second thickness converts back to the triple SNIP having the first thickness when sequentially subjected to the first external compressive load and the third temperature.

In one embodiment, the variable capacitor device 100 according to the second aspect has a first capacitance at the first thickness and the first temperature, a second capacitance at the second thickness and the second temperature, and a third capacitance at the third thickness and the third temperature, wherein a ratio of the third capacitance to the second capacitance is in the range of 2.5:1 to 1.5:1, preferably 2:1 to 1.5:1, and a ratio of the second capacitance to the first capacitance is in the range of 2.5:1 to 1.5:1, preferably 2:1 to 1.5:1.

Specification of a variable capacitor device in accordance with the second aspect (except the triple shape-memory polymer) has been described previously in the first aspect.

According to a third aspect the present disclosure relates to a method of manufacturing a variable capacitor device 100, involving mixing polyvinyl alcohol and a crosslinking agent in water to form a polymer solution. In one embodiment, a concentration of polyvinyl alcohol in the polymer solution is preferably within the range of 0.01% to 10% by mass, preferably within the range of 0.01% to 1% by mass, more preferably within the range of 0.02% to 0.5% by mass, and still more preferably within the range of 0.05% to 0.2% by mass.

In one embodiment, a crosslinked structure of the polyvinyl alcohol can be formed by reacting the polyvinyl alcohol with the cross-linking agent. Accordingly, the crosslinked structure of the polyvinyl alcohol may be formed by reacting the hydroxyl groups in the polyvinyl alcohol with functional groups of the crosslinking agent. Examples of the functional groups that are reactable with the hydroxyl groups of polyvinyl alcohol include aldehyde groups, hydroxyl groups, and carboxyl groups. Therefore, the crosslinking agents may include chemical compounds having at least two aldehyde groups, at least two hydroxyl groups, or at least two carboxyl groups. Examples of the crosslinking agents having at least two aldehyde groups include glutaraldehyde, tnalonaldehyde, succinaldehyde, adipaldehyde, and phthalaldehyde. Also, examples of the crosslinking agents having at least two carboxyl groups include oxalic acid, malonic acid, succinic acid, glutaric acid, adipic acid, and phthalic acid. Further, examples of the crosslinking agents having at least two hydroxyl groups include boric acid and borate salt. Among these crosslinking agents, glutaraldehyde is preferred because it can initiate a crosslinking reaction at a relatively low temperature, for example, at a reaction temperature in the range of 10° C. to 100° C., more preferably 20° C. to 60° C. A concentration of the crosslinking agent in the polymer solution may be within the range of 0.001 to 10.0 M (mol/L), more preferably within the range of 0.1 to 3.0 M (mol/L), and still more preferably within the range of 0.5 to 1.0 M (mol/L).

In one embodiment, the method further involves adding a dopant 104 to the polymer solution prior to the casting, wherein a volume fraction of the dopant 104 is in the range of 0.005-0.1, preferably 0.005-0.05, more preferably 0.01-0.05, with the volume fraction being relative to the total volume of the dielectric layer. Specification of the dopant 104 has been discussed previously in the first aspect of this disclosure. In one embodiment, the polymer solution is mixed with a centrifugal mixer or a three-roll mill. In another embodiment, the polymer solution is sonicated after being mixed with a centrifugal mixer or a three-roll mill.

The method of manufacturing a variable capacitor device 100 further involves casting the polymer solution in a mold to cure the polyvinyl alcohol with the crosslinking agent, and to form a polymer film having a thickness of less than 5 mm, preferably less than 3 mm, more preferably less than 2 mm. Curing temperature may be within the range of 10° C. to 100° C., more preferably 20° C. to 80° C., more preferably 60° C. to 80° C., and the polymer solution is maintained at the curing temperature for at least 30 hours, preferably at least 35 hours. The mold may have a cubic, a circular, an elliptical, a triangular, or a star-shaped geometry. The mold may be made of glass, or a polymer such as silicon rubber or polytetrafluoroethylene.

In one embodiment, for capacitors that are used in microcircuits, a thin film having a thickness in the range 10 nm-500 µm, preferably 100 nm-100 µm, more preferably 1-10 µm is prepared. Thin film may be produced using a thin film deposition technique, including plating, chemical solution deposition, spin coating, chemical vapor deposition (CVD), plasma enhanced CVD, atomic layer deposition, electron beam evaporation, thermal evaporation, molecular beam epitaxy, sputtering, pulsed laser deposition, cathodic arc deposition, and electro-hydrodynamic deposition.

The method of manufacturing a variable capacitor device 100 further involves removing the polymer film from the mold, after a water content of the polymer film is reduced to less than 0.5 wt %, preferably less than 0.2 wt %, more preferably less than 0.1 wt %. Reducing the water content of the polymer film may be performed by thermal evaporation, preferably vacuum evaporation, and/or flowing a dry gaseous stream over the polymer film.

In one preferred embodiment, the method further involves coating opposing side surfaces of the polymer film with a metal. The metal may be one selected from the group consisting of gold, platinum, silver, copper, aluminum, titanium, vanadium, chromium, nickel, palladium, rhenium, tellurium, iron, iridium, osmium, rhodium, tantalum, and zirconium. A thickness of the metal that is coated on the opposing side surfaces of the polymer film is within the range of 5-80 nm, preferably 10-50 nm, more preferably about 30 nm. In one embodiment, multiple layers of the metal are coated on the polymer film, wherein each layer has a thickness within the range of 5-80 nm, preferably 10-50 nm, more preferably about 30 nm. Coating may cover at least 50%, preferably at least 80% more preferably at least 95% of the side surfaces of the polymer film; however, it does not cover lateral side surfaces of the polymer film. Although said metal may be different than the metal used in the composition of the first and the second metal plates, it is preferably the same as the first and the second metal plates.

The method of manufacturing the variable capacitor device 100 further involves sandwiching the polymer film between a first and a second metal plate. In one embodiment, the first and the second metal plates 106 are substantially similar. Specification of the first and the second metal plates have been described previously.

The examples below are intended to further illustrate protocols for a variable capacitor device and a method of preparation thereof, and are not intended to limit the scope of the claims.

Example 1

The chemicals used in various embodiments of the present invention were supplied by Aldrich Company as analytical grade reagents. The raw materials were used as purchased without further purification. Millipore MilliQ purified deionized water was used in all operations. The poly vinyl alcohol was dissolved in 100 ml deionized water at 90° C. Then, glutaraldehyde was added to the PVA solution and it was stirred for 36 h. The resulting solution was casted on a cuboid glass mold to get a solid dielectric layer.

Example 2

Figure 3:
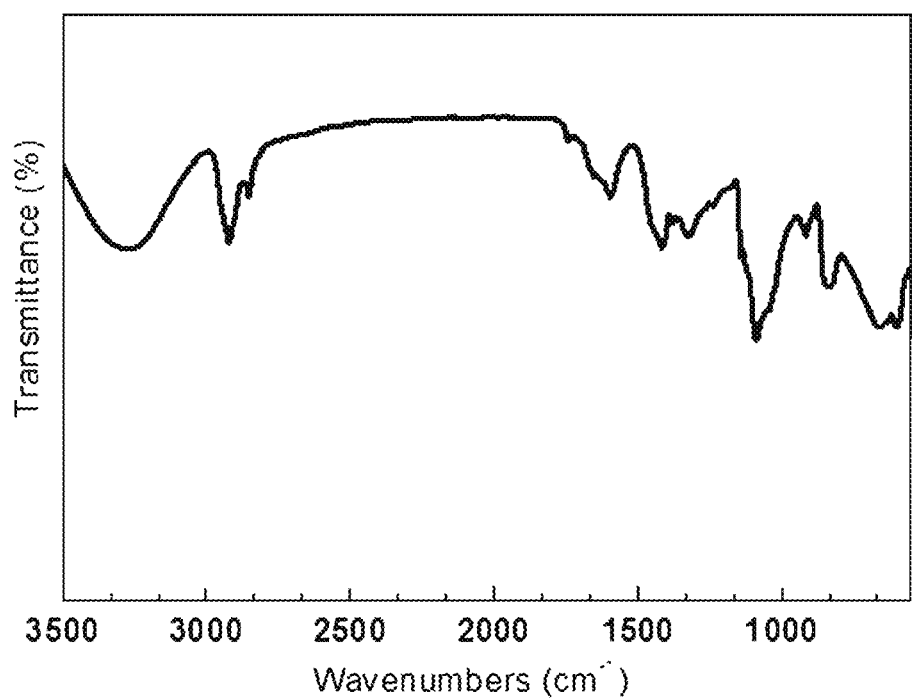
FIG. 3 represents a FTIR spectrum of a shape-memory polymer in a transmittance mode.

To further confirm the chemical composition of the PVA dielectric layer, FTIR spectroscopy of the dielectric layer was perfoi wed and the resultis shown in FIG. 3. The peak as observed at around 3300 $cm^{-1}$ corresponds to —OH group in the polymer backbone. The peaks associated with the —$CH_2$ asymmetric and symmetric stretching bands were also observed at 2918 $cm^{-1}$ and 2852 $cm^{-1}$, respectively. Also, the peak at 1413 $cm^{-1}$ corresponds to the C—C stretching.

Figure 4:
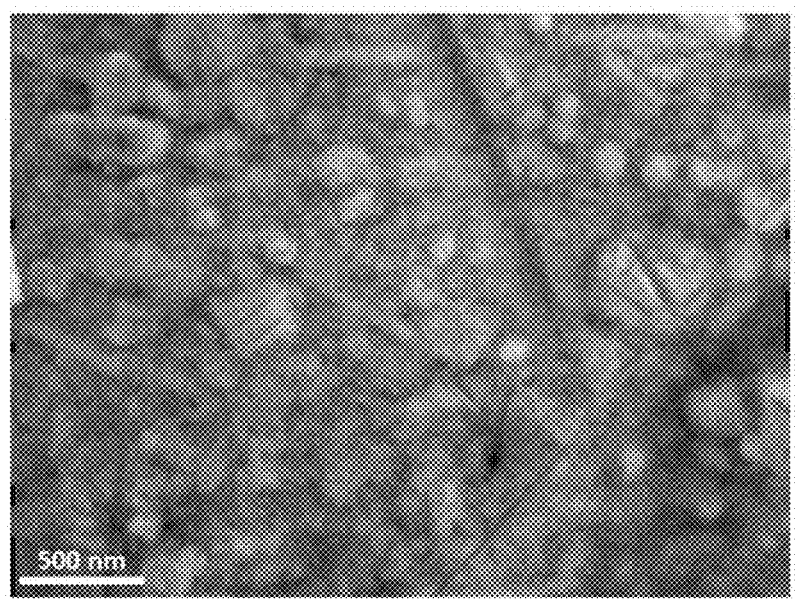
FIG. 4 is a SEM micrograph of a free surface of the shape-memory polymer.

Additionally, the scanning electron microscopy micrograph of the dielectric layer is shown in FIG. 4.

Figure 5:
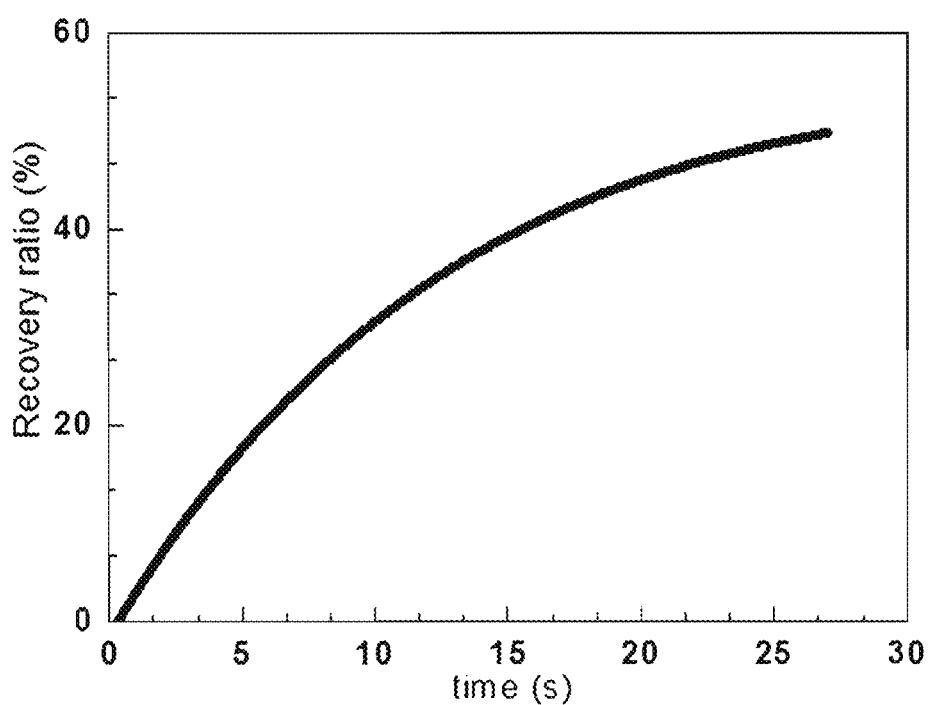
FIG. 5 represents a graph of recovery time vs. recovery ratio associated with the shape-memory polymer.

Furthermore, FIG. 5 represents a relationship between the recovery time and the recovery ratio of a PVA dielectric layer. The recovery time is defined as the amount of time that is required for a PVA dielectric layer to switch back to the original shape.

Example 3

A shape memory capacitor was formed by sandwiching a 1 mm-thick layer between two gold electrodes. A layer of gold was deposited on each side of the shape memory dielectric layer. The capacitance of the capacitor was measured and the real and imaginary parts of the dielectric constant were determined.

Figure 6A:
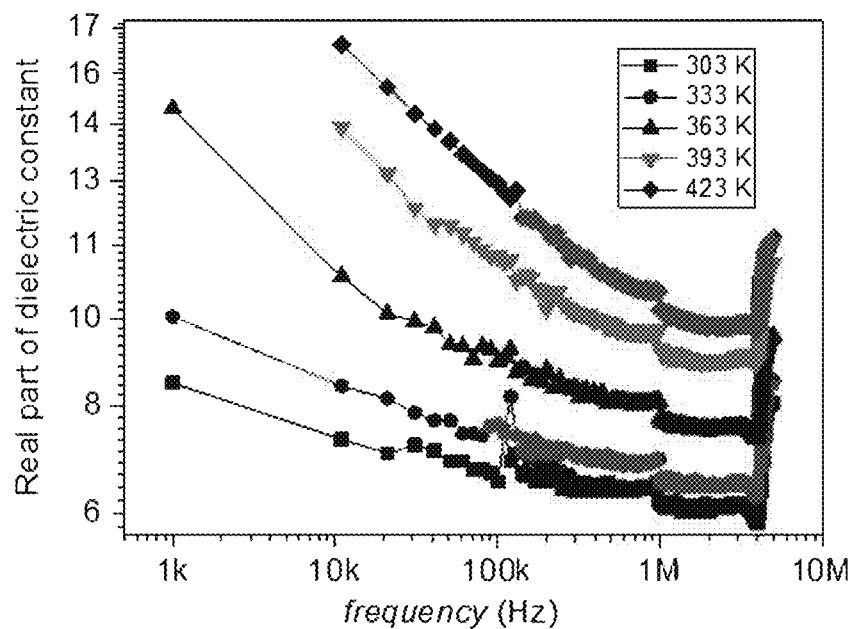
FIG. 6A represents the real component of the dielectric constant of the shape-memory polymer in a frequency sweep.
Figure 6B:
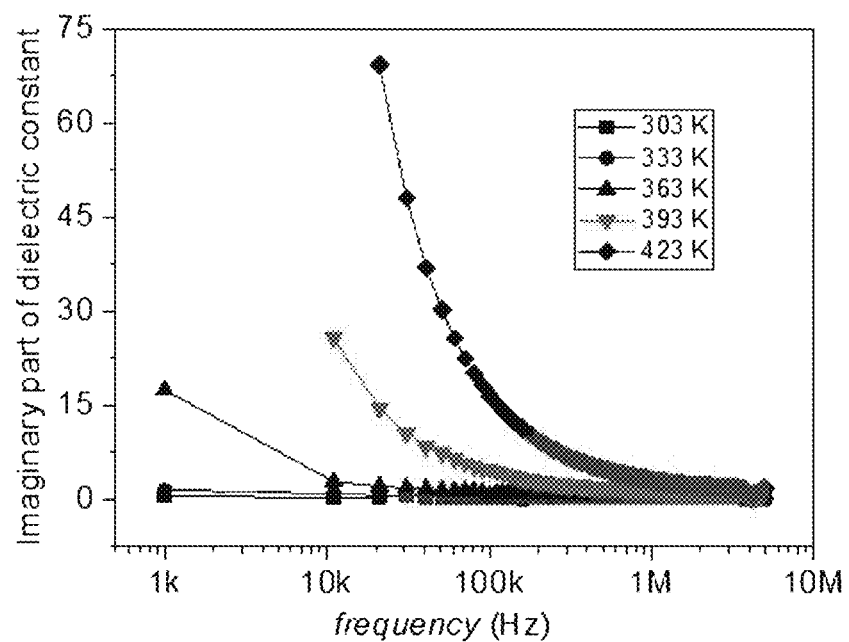
FIG. 6B represents the imaginary component of the dielectric constant of the shape-memory polymer in a frequency sweep.

The real and the imaginary components of the dielectric constant of the PVA dielectric layer were measured as function of frequency as shown in FIG. 6A and FIG. 6B. According to these figures, the dielectric constant of the PVA dielectric layer revealed a dispersive behavior. For example, the real component of the dielectric constant increased from 7.41 to 16.87 at 10 kHz upon increasing temperature. The imaginary component of the dielectric constant was also revealed a dramatic increase with increasing temperature.

Example 4

Figure 7:
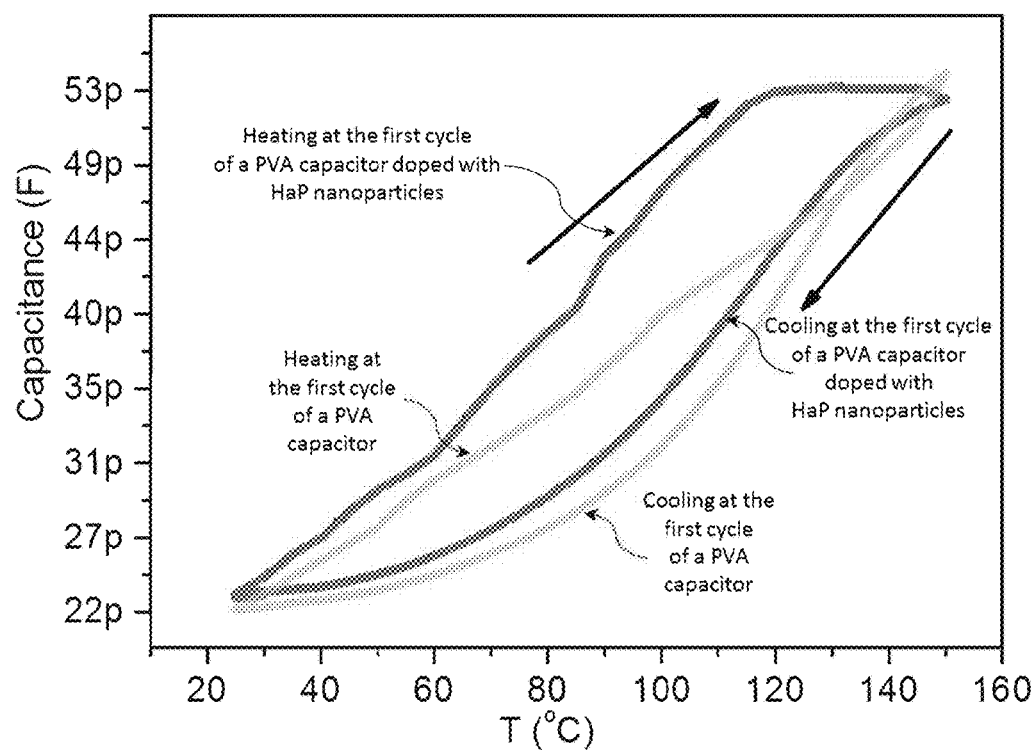
FIG. 7 represents a graph of capacitance vs. temperature of the variable capacitor device.

FIG. 7 shows capacitance vs. temperature of the PVA shape memory capacitor including 1% hydroxyapatite nanoparticles. The plot of the capacitance vs. temperature indicates a hysteresis loop which follows in a counter-clockwise direction, because the deformation only happens in the shape memory layer. The memory effect of the capacitor mainly results from the deformation effect into the shape memory layer. The presence of the hydroxyapatite nanoparticles improved the memory effect of the capacitor.

The invention claimed is:
1. A variable capacitor device, comprising:
a dielectric layer comprising a shape-memory polymer;
a first metal plate and a second metal plate, wherein the dielectric layer is sandwiched between the first and the second metal plates;
wherein the shape-memory polymer has a first thickness at a first temperature under a first external compressive load, a second thickness at a second temperature under a second external compressive load, and the shape memory polymer having the second thickness is configured to convert to the shape-memory polymer having the first thickness when sequentially subjected to the first external compressive load and the second temperature, and wherein the first thickness is greater than the second thickness, the second temperature is greater than the first temperature, and the second external compressive load is greater than the first external compressive load.

2. The variable capacitor device of claim 1, which has a first capacitance at the first thickness and the first temperature, and a second capacitance at the second thickness and the second temperature, wherein a ratio of the second capacitance to the first capacitance is in the range of 2.5:1 to 1.5:1.

3. The variable capacitor device of claim 1, wherein the dielectric layer has a thickness in the range of 0.1-2 mm.

4. The variable capacitor device of claim 1, wherein the shape memory polymer has a glass transition temperature in the range 50-100° C.

5. The variable capacitor device of claim 1, wherein the shape-memory polymer is at least one selected from the group consisting of polyvinyl alcohol, polyurethane, polyvinylidene difluoride, polylactic acid, polycaprolactone, polyethylene, polyethylene glycol, polyether ether ketone, polyethyl methacrylate, polystyrene, polytetramethylene glycol, polyisoprene, polybutadiene, poly(styrene-butadiene), polynorbornene, poly(norbornene-cyclooctene), poly(tert-butyl acrylate-butyl acrylate), poly(ethyleneterephthalate)-block-poly(ethyleneoxide), polystyrene-block-poly(1,4-butadiene), poly(2-methyl-2-oxazoline)-block-poly(tetrahydrofuran)-block-poly(2-methyl-2-oxazoline), and epoxy.

6. The variable capacitor device of claim 1, wherein the dielectric layer further comprises at least one dopant selected from the group consisting of hydroxyapatite, polyhedral oligomeric silsesquioxane, titanium oxide nanoparticles, tin oxide nanoparticles, zinc oxide nanoparticles, zinc sulfide nanoparticles, cadmium oxide nanoparticles, graphene sheets, quantum dots, carbon nanotubes, and fullerenes.

7. The variable capacitor device of claim 6, wherein a volume fraction of said dopant is in the range of 0.005-0.1, with the volume fraction being relative to the total volume of the dielectric layer.

8. The variable capacitor device of claim 6, wherein a morphology of said dopant is at least one selected from the group consisting of a nanosphere, a nanosheet, a nanotube, a nanofiber, a nanowire, a nanodisk, a nanocube, a nanorod, a nanoring, and a nanostar.

9. The variable capacitor device of claim 6, wherein said dopant has an average particle size in the range of 1-100 nm.

10. The variable capacitor device of claim 1, wherein the shape memory polymer is a polyvinyl alcohol polymer which is crosslinked with a crosslinking agent having at least two aldehyde groups or at least two carboxyl groups.

11. The variable capacitor device of claim 10, wherein the crosslinking agent is glutaraldehyde.

12. The variable capacitor device of claim 1, wherein each of the first and the second metal plates comprises one metal selected from the group consisting of gold, platinum, silver, copper, aluminum, and titanium.

13. A variable capacitor device, comprising:
a dielectric layer comprising a triple shape-memory polymer;
a first metal plate and a second metal plate, wherein the dielectric layer is sandwiched between the first and the second metal plates;
wherein the triple shape-memory polymer has a first thickness at a first temperature under a first external compressive load, a second thickness at a second temperature under the first external compressive load, a third thickness at a third temperature under a second external compressive load, and the triple shape memory polymer having the third thickness is configured to convert to the triple shape-memory polymer having the second thickness when sequentially subjected to the first external compressive load and the second temperature, and the triple shape memory polymer having the second thickness is configured to convert to the triple shape-memory polymer having the first thickness when sequentially subjected to the first external compressive load and the third temperature, and
wherein the first thickness is greater than the second thickness and the second thickness is greater than the third thickness, the third temperature is greater than the second temperature and the second temperature is greater than the first temperature, and the second external compressive load is greater than the first external compressive load.

14. The variable capacitor device of claim 13, which has a first capacitance at the first thickness and the first temperature, a second capacitance at the second thickness and the second temperature, and a third capacitance at the third thickness and the third temperature, wherein a ratio of the third capacitance to the second capacitance is in the range of 2.5:1 to 1.5:1, and a ratio of the second capacitance to the first capacitance is in the range of 2.5:1 to 1.5:1.

15. The variable capacitor device of claim 13, wherein the triple shape-memory polymer is a combination of two shape-memory polymers each is selected from the group consisting of polyvinyl alcohol, polyurethane, polyvinylidene difluoride, polylactic acid, polycaprolactone, polyethylene, polyethylene glycol, polyether ether ketone, polyethyl methacrylate, polystyrene, polytetramethylene glycol, polyisoprene, polybutadiene, poly(styrene-butadiene), polynorbornene, poly(norbornene-cyclooctene), poly(tert-butyl acrylate-butyl acrylate), poly(ethyleneterephthalate)-block-poly(ethyleneoxide), polystyrene-block-poly(1,4-butadiene), poly(2-methyl-2-oxazoline)-block-poly(tetrahydrofuran)-block-poly(2-methyl-2-oxazoline), and epoxy.

16. The variable capacitor device of claim 13, wherein the triple shape-memory polymer is an interpenetrating polymer network of two crosslinked polymers having a glass transition temperature difference within the range of 50-200° C.

* * * * *